United States Patent
Rosel

(10) Patent No.: US 7,689,936 B2
(45) Date of Patent: Mar. 30, 2010

(54) PROCESS FOR SELECTING AND HANDLING OBJECTS IN A COMPUTER-AIDED DESIGN SYSTEM

(75) Inventor: Sebastien Rosel, Gif sur Yvette (FR)

(73) Assignee: Dassault Systemes, Suresnes Cedex (FR)

( * ) Notice: Subject to any disclaimer, the term of this patent is extended or adjusted under 35 U.S.C. 154(b) by 404 days.

(21) Appl. No.: 11/077,957

(22) Filed: Mar. 11, 2005

(65) Prior Publication Data

US 2005/0204312 A1 Sep. 15, 2005

(30) Foreign Application Priority Data

Mar. 12, 2004 (EP) .................................. 04290685

(51) Int. Cl.
*G06F 3/048* (2006.01)
(52) U.S. Cl. ...................... 715/852; 715/822; 715/823; 715/860; 715/862
(58) Field of Classification Search .................. 715/852, 715/862, 777, 810, 812, 822, 835, 823, 848–851, 715/856–861; 345/156–167
See application file for complete search history.

(56) References Cited

U.S. PATENT DOCUMENTS

| | | | |
|---|---|---|---|
| 3,187,532 A | | 6/1965 | Furth |
| 5,313,228 A | * | 5/1994 | Freeman ..................... 345/619 |
| 5,329,613 A | | 7/1994 | Brase et al. ................. 345/422 |
| 5,371,845 A | | 12/1994 | Newell et al. ............... 715/808 |
| 5,404,439 A | * | 4/1995 | Moran et al. ................ 715/814 |
| 5,459,831 A | * | 10/1995 | Brewer et al. ............... 715/853 |
| 5,479,599 A | * | 12/1995 | Rockwell et al. ............ 715/837 |
| 5,555,357 A | * | 9/1996 | Fernandes et al. .......... 345/441 |
| 5,564,004 A | * | 10/1996 | Grossman et al. ........... 715/835 |
| 5,740,390 A | * | 4/1998 | Pickover et al. ............. 715/835 |
| 5,754,179 A | * | 5/1998 | Hocker et al. ............... 715/835 |
| 5,757,358 A | | 5/1998 | Osga .......................... 715/862 |

(Continued)

FOREIGN PATENT DOCUMENTS

EP 361870 A2 * 4/1990

(Continued)

OTHER PUBLICATIONS

European Search Report and Communication for EP 04290685.9 dated Aug. 12, 2004.

(Continued)

*Primary Examiner*—Ba Huynh
*Assistant Examiner*—Eric Wiener
(74) *Attorney, Agent, or Firm*—Baker & Hostetler LLP

(57) ABSTRACT

Several elements are displayed on a computer display. The user is provided with a haptic device, for moving a cursor over the display. Distances between the cursor and the various elements are computed; the element with the smallest distance is highlighted on the display. When the user moves the haptic device, the identified element is changed, according to the distance between the cursor and the various elements. The user selects the identified element by actuating a select button. The invention makes it possible for the user to select one of the displayed elements, without having to move the cursor over the element to be selected. No prior knowledge of the shape of the elements is required for carrying out the selection process.

21 Claims, 4 Drawing Sheets

U.S. PATENT DOCUMENTS

| | | | | |
|---|---|---|---|---|
| 5,808,604 | A * | 9/1998 | Robin | 715/862 |
| 5,861,889 | A * | 1/1999 | Wallace et al. | 345/619 |
| 5,867,163 | A * | 2/1999 | Kurtenbach | 715/840 |
| 5,889,523 | A * | 3/1999 | Wilcox et al. | 715/854 |
| 5,920,313 | A * | 7/1999 | Diedrichsen et al. | 715/767 |
| 5,977,973 | A * | 11/1999 | Sobeski et al. | 715/798 |
| 5,995,101 | A * | 11/1999 | Clark et al. | 715/711 |
| 6,084,598 | A * | 7/2000 | Chekerylla | 345/441 |
| 6,091,416 | A * | 7/2000 | Cragun | 715/837 |
| 6,104,398 | A * | 8/2000 | Cox et al. | 715/821 |
| 6,204,849 | B1 * | 3/2001 | Smith | 715/835 |
| 6,230,174 | B1 * | 5/2001 | Berger et al. | 715/201 |
| 6,266,043 | B1 | 7/2001 | Robin | 715/858 |
| 6,469,709 | B1 * | 10/2002 | Sakai | 345/619 |
| 6,480,813 | B1 | 11/2002 | Bloomquist et al. | 703/1 |
| 6,781,597 | B1 * | 8/2004 | Vrobel et al. | 345/619 |
| 6,829,615 | B2 * | 12/2004 | Schirmer et al. | 707/102 |
| 6,891,551 | B2 * | 5/2005 | Keely et al. | 715/762 |
| 7,000,197 | B1 * | 2/2006 | Bou et al. | 715/812 |
| 7,069,516 | B2 * | 6/2006 | Rekimoto | 715/757 |
| 7,110,005 | B2 * | 9/2006 | Arvin et al. | 345/619 |
| 7,302,650 | B1 * | 11/2007 | Allyn et al. | 715/859 |
| 7,509,593 | B2 * | 3/2009 | Kaminagayoshi | 715/862 |
| 2002/0023111 | A1 * | 2/2002 | Arora et al. | 707/513 |
| 2004/0001110 | A1 * | 1/2004 | Khan | 345/848 |
| 2004/0135817 | A1 * | 7/2004 | Daughtery et al. | 345/823 |
| 2005/0108620 | A1 * | 5/2005 | Allyn et al. | 715/500 |
| 2005/0144571 | A1 * | 6/2005 | Loverin et al. | 715/822 |

FOREIGN PATENT DOCUMENTS

| | | |
|---|---|---|
| JP | 5-250458 | 9/1993 |
| JP | 6-103362 | 4/1994 |
| JP | 6-208447 | 7/1994 |
| JP | 6-301763 | 10/1994 |
| JP | 2001-027924 | 1/2001 |

OTHER PUBLICATIONS

E. Bier, "Snap-Dragging in Three Dimensions," Comput. Graph. (USA), Computer Graphics, Mar. 1990, USA, vol. 24, No. 2, Mar. 25, 1990, pp. 193-204.

N. Sproull, "Principles of Interactive Computer Graphics," McGraw-Hill, Tokyo, Japan, 1979, pp. 170-173 and 448-449.

Anonymous, "Ashlar-Vellum: Cobalt, Xenon & Argon: Designer Elements—3D Modeling User Guide (excerpt)," Ashlar-Vellum Incorporated, Jan. 2003, pp. 0 and 3.1-3.14.

I. Sutherland, "Sketchpad: A man-machine graphical communication system," University of Cambridge Technical Report, Sep. 2003, pp. 1-149.

E. Mortensen et al., "Toboggan-Based Intelligent Scissors with a Four-Parameter Edge Model," Proceedings. 1999 IEEE Computer Society Conference on Computer Vision and Patter Recognition, Jun. 23, 1999, pp. 452-458.

E. Bier et al., "Snap-Dragging," Computer Graphics, New York, NY, US, Aug. 18, 1986, vol. 20, No. 3, pp. 233-240.

Upperspace Corporation: "DesignCAD 3D MAX Version 12.0 Reference Manual (excerpt)" DesignCAD 3D MAX Version 12.0 Reference Manual, [Online] 2001, pp. 1-28.

* cited by examiner

PROCESS FOR SELECTING AND HANDLING OBJECTS IN A COMPUTER-AIDED DESIGN SYSTEM

CROSS REFERENCE TO RELATED APPLICATIONS

This application claims priority to European patent application no. 04290685.9 filed Mar. 12, 2004, which is currently pending.

FIELD OF THE INVENTION

The invention relates to the field of computers programs and systems, and more specifically to part design programs and systems.

BACKGROUND OF THE INVENTION

A number of systems and programs are offered on the market for the design of parts or assemblies of parts, such as the one provided by the applicant under the trademark CATIA. These so-called computer-aided design (CAD) systems allow a user to construct and manipulate complex three-dimensional (3D) models of parts or assembly of parts. A number of different modelling techniques can be used to create a model of an assembly. These techniques include solid modelling, wire-frame modelling, and surface modelling. Solid modelling techniques provide for topological 3D models, where the 3D model is a collection of interconnected edges and faces, for example. Geometrically, a 3D solid model is a collection of trimmed or relimited surfaces that defines a closed skin. The trimmed surfaces correspond to the topological faces bounded by the edges. The closed skin defines a bounded region of 3D space filled with the part's material. Wire-frame modelling techniques, on the other hand, can be used to represent a model as a collection of simple 3D lines, whereas surface modelling can be used to represent a model as a collection of exterior surfaces. CAD systems may combine these, and other, modelling techniques, such as parametric modelling techniques. CAD systems thus provide a representation of modelled objects using edges or lines, in certain cases with faces. The modelled objects comprise a number of lines or edges or other elements. These elements may be acted upon by the user of the system in the design process. The user may wish to select or designate one given element in the modelled object, for instance for displaying its properties, erasing or cancelling it, or for being able to act upon the selected element. The prior art suggests using a haptic device such as a mouse for selecting elements in a design system, as explained below. The prior art solutions are explained in reference to a mouse; displacements of the mouse result in displacements of a cursor on the computer display. The mouse is provided with a button, which the user may act upon for "clicking".

A known solution for selecting an element displayed on the display of a computer system is to select the element over which the cursor of the mouse is placed at the time the user clicks on the mouse button. In such a system, the user needs to move the mouse, so that the cursor on the display is above the element to be selected. When this is the case, the user presses the button of the mouse for selecting the element. This solution requires the user to move the mouse, so that the cursor is above the element to be selected; this may result in numerous movements of the mouse when various objects have to be selected. This may also cause problems where elements to be selected are close one to the other on the display; indeed, the user may select an element which is not the relevant one, but which happens to be close to the relevant one.

To address the problem of selection of an element, it was proposed to highlight the element over which the cursor is located. This solution is used in the CAD system provided by Dassault Systemes under the trademark CATIA; in this system, an element is highlighted on the display when the cursor of the mouse lies within the boundaries of the element on the display. This results in the user being provided, at any time, with an indication of the element he would select if he clicked on the mouse button. This solution addresses the problem of selecting an element among several elements on the display.

The prior art also suggests using picking zones for helping a user in selecting an element on the display. A picking zone is a virtual zone of the display, which is associated to a displayed element and extends beyond this element. Whenever the cursor is within the picking zone, a click on the mouse button results in the associated element being selected. This solution is used in the menus of Microsoft® Word 2000: each icon or text representative of a function in the menu or in a tool bar is provided with a rectangular picking zone. When the user moves the mouse so that the cursor travels over the various items of a tool bar, the corresponding picking zone is highlighted. Providing such a picking zone makes selection easier, since the mouse cursor does not have to be exactly over the relevant element for permitting this element to be selected. However, such picking zones are easy to define in a menu or in a tool bar, where the position of the different objects is predetermined, so that the picking zones may also be predetermined.

Another issue in design systems is to allow the user to act on displayed elements—for instance for changing the shape of a displayed element. One prior art solution is to provide displayed elements with handles, which may be selected by the user. Such handles are exemplified in FIG. 1, in the case of an image created in Microsoft® Word 2000. FIG. 1 shows an ellipsis 2, which has nine handles. Handles 4, 6, 8 and 10 are located at the respective corners of a rectangle containing the ellipsis and the sides of which are respectively parallel to the major and minor axes of the ellipsis. Handles 4, 6, 8 and 10 may be used for sizing up and down the ellipsis, in a proportional transformation centred on the opposed handle; this is done by placing the cursor over one of the handles, pressing the button, dragging the handle to the appropriate location and releasing the handle. Handles 12, 14, 16 and 18 are located at the middles of the sides of the rectangle and are used for lengthening or shortening the ellipsis, in directions parallel to the sides of the rectangle. Last handle 20 is used for rotating the ellipsis, around a centre of rotation located substantially in the middle of the ellipsis. The handles in this prior art system only appear when the element is selected. For instance, in FIG. 1, the handles only appear when the ellipsis is selected, that is when the user clicks on a point which lies within the ellipsis. Each handle has a picking zone, which helps the user in selecting and dragging the handle.

Handles, like picking zones, still require the user to move the mouse, so that the cursor travels over the display. In a design system, or more generally in any system where there are numerous elements to select or handles to act upon, this results in the mouse being displaced over considerable distances. In addition, for selecting elements, there is a need to place the mouse cursor exactly over the element or over the picking zone of the element. This requires the user to pay attention to the specific location of the mouse.

Thus, there exists a need for a solution, allowing a user of a computer system to select elements displayed on the system. The solution should preferably be easy to understand and FIG. 7 shows a display of a system embodying the invention.

SUMMARY OF THE INVENTION

According to the invention, there is provided a computer-implemented process for selecting an element on a display, comprising the steps of
displaying at least two elements on a display;
displaying a cursor of a haptic device on the display;
comparing distances between the elements and the cursor;
identifying on the display one of the elements, according to the results of the comparing step;
upon actuation of the user on a selector, selecting the identified element.

In this process, the compared distance, for an element, may be:
the Euclidian distance between the cursor and a point of the element;
the weighted Euclidian distance between the cursor and a point of the element; the weighting factor for an element may then be representative of the surface of the element on the display;
the distance between the cursor and the outline of the element.

Where a point is used, it may be, for a 3D-element, the projection on the display surface of a barycentre of the 3D element.

An element—such as a tool handle—may be associated with a half-line; the distance may then be the distance between the cursor and the associated half-line, or the weighted distance between the cursor and the associated half-line.

In the step of identifying, one may identify to the user the element with the smallest distance.

The invention also provides a computer-implemented process for selecting elements among two sets of elements on a display, comprising the steps of
displaying at least two elements of the first set on a display;
displaying at least two elements of the second set on the display;
displaying a cursor of a haptic device on the display;
selecting an element of the first set according to the process discussed above
selecting an element of the second set according to the process discussed above.

This makes it possible to display and select objects as well as tool handles for acting on the objects.

The invention further provides a program for selecting an element on a display in a computer system, having a display, a haptic device and a selector. The program has routines for carrying out the various steps of the process.

A computer-aided design system embodying the invention will now be described, by way of non-limiting example, and in reference to the accompanying drawings.

DETAILED DESCRIPTION OF THE INVENTION

The invention makes it possible to select one element on a display, according to the position of a cursor. The distances between the various elements and the cursor are computed. The distances are compared and the closest element to the cursor is identified to the user—by highlighting or by any other solution. Thus, the user need not move the cursor into a picking zone or over the element to select the identified element. The invention applies to objects—such as parts of modelled objects—represented on the display; this embodiment is described below in reference to FIGS. 2 and 3. The invention also applies to handles and tools; this embodiment is described below in reference to FIGS. 4 to 6. FIG. 7 shows an example where the invention is used for selecting both modelled objects and handles.

Figure 2:
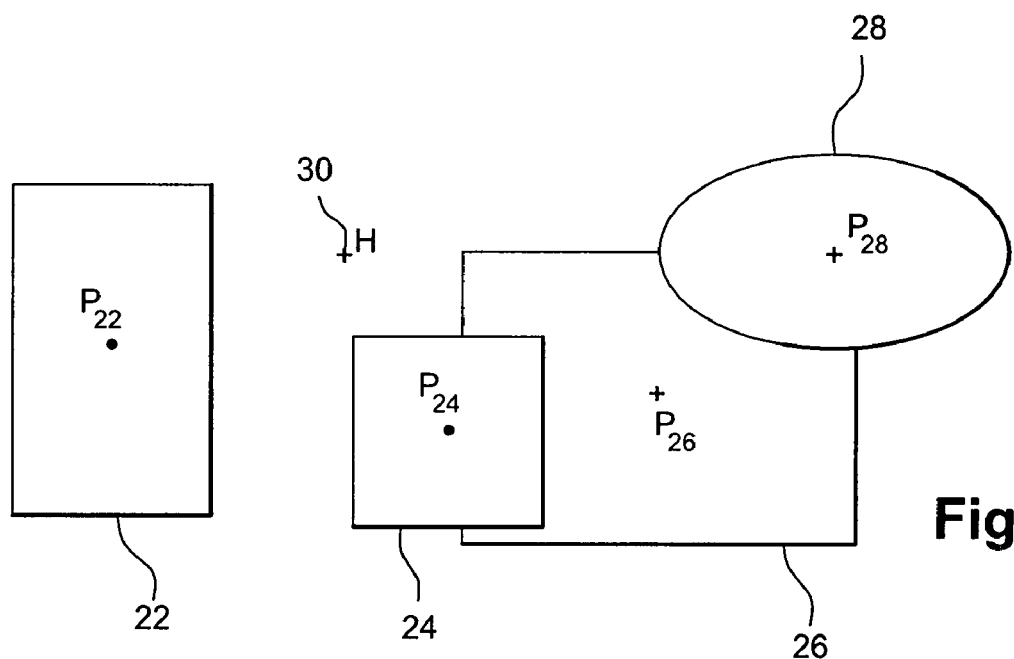
FIG. 2 is a view of a display with various elements, in an embodiment of the invention.

FIG. 2 is a view of a display with various elements, in an embodiment of the invention. It shows several elements 22, 24, 26 and 28, as well as the cursor 30 of a haptic device. When the user of the computer system moves the haptic device, the cursor moves over the display. The user may also select an element, thanks to a button or any other similar selector on the haptic device or elsewhere. The operation and use of a haptic device is known per se and is not discussed further.

Figure 3:
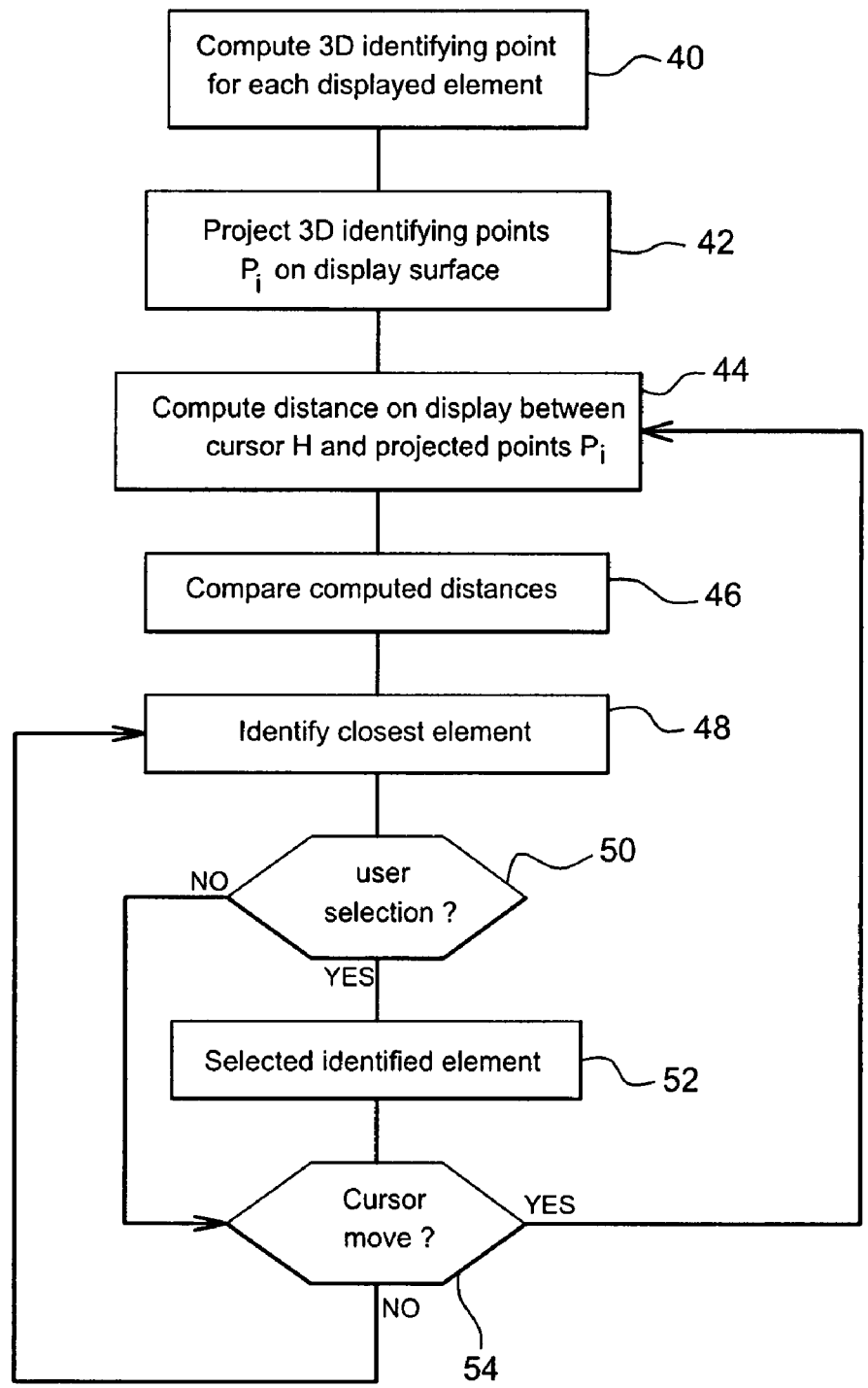
FIG. 3 is a flowchart of a process according to an embodiment of the invention.

FIG. 3 is a flowchart of a process according to an embodiment of the invention. In steps 40-44, a distance between each element and the cursor of the haptic device is computed. In steps 46-52, distances are used for allowing the user to select the displayed elements.

In step 40, for each element displayed on the computer display, a 3D-identifying point is computed. This point may for instance be the barycentre or centre of gravity of the relevant element. One may also use not only one point, but several points representative of the element.

In step 42, the 3D identifying points computed in step 20 are projected on the 2D surface of the display. This provides, for each displayed element, a 2D-identifying point on the display. For the sake of explanation, the 2D-identifying point is represented in FIG. 2 and reference $P_i$, for each element i=22, 24, 26 and 28. In the actual embodiment of the invention, the 2D-identifying points need not be displayed to the user. Reference H in FIG. 2 designates the haptic device.

Computing this 2D-identifying point by projecting the 3D-identifying point makes it possible to provide an identifying point which is representative of the 3D-view of the various elements. One advantage is that the 3D-identifying point computed in step 20 may be used for any view of the modelled objects; thus, if the view displayed changes, there is no need to compute again the barycentre. The only step to be carried out is the projection of the already computed barycentre on the display surface. This projection is easily carried out and does not require long computations. Another advantage of using 3D-identifying points is that the identifying point on the display is representative of the actual shape of each element—even though part of the element may be hidden. For instance, in FIG. 2, identifying point $P_{26}$ is actually in the centre of the rectangle 26, even though part of this rectangle is hidden by elements 24 and 28.

In step 44, a distance $\delta_i$ between the cursor and the 2D-identifying point is computed, for each element of the display. At this step, one may simply use the coordinate of the cursor and the coordinates of the 2D-identifying points in the display, in order to compute the relevant distance. In the simplest embodiment of the invention, the distance is the usual Euclidian distance in the coordinates system of the display. Using the references of FIG. 2, the distance $\delta_i$ between element i and haptic device h is therefore $HP_i$.

One may also take into account the size of the displayed element in order to compute the distance. This makes it possible to identify and select more easily elements which have a larger size on the display. In this case, for a given element i, distance $\delta_i$ is computed as the ratio of the Euclidian distance $HP_i$ by the size $\delta_i$ of the element on the display, thus $$\delta_i = HP_i/s_i$$

This has the effect that a larger element is identified more easily.

Another solution is to compute the distance as the minimum distance between the cursor and the outline of an element. This solution is particularly advantageous with elongated elements; for such elements, the distance to the 2D-identifying point may be important, even though the cursor is close to the outline of the object.

In step 46, the computed distances are compared. One understands that there are many solutions for computing and comparing the distances; in the example of FIG. 3, steps 44 and 46 are separate; practically speaking, one may proceed with both steps concurrently, e.g. by computing the distance to the first element; and for each subsequent element, compute the distance to the subsequent element, compare it with the previously computed distance and replace the previously computed distance by the distance to the subsequent element if the latter is smaller.

Once all elements are scanned, the smallest distance is obtained.

In step 48, based on the results of the comparison, one of the elements is identified to the user. Preferably, the identified element is the closest element, that is the element for which the distance computed in step 46 is the smallest one. In the example where the distance is the Euclidian distance on the screen, element 24 of FIG. 2 would be identified; indeed, in the example of FIG. 2

$$HP_{24} < HP_{22} < HP_{26} < HP_{28}$$

If one used weighted distances $HP_i/s_i$, element 22 would be selected, indeed, $$HP_{24}/s_{24} < HP_{22}/s_{22}$$

In this example, element 22 is identified, although its identifying point $P_{24}$ is remoter from the cursor H than identifying point $P_{22}$ of element 22.

If one used distances to the outline, element 26 would be selected.

Identification to the user may be carried out in various ways. On may highlight the element. Colour coding may be used; the element may be flashed on the display. Generally speaking, one may use any solution which allows the user to understand which of the elements is currently identified. Note that in the previous example, one discusses identification of a full displayed element; one could also allow the user to select edges of the displayed elements. In such an embodiment, one would simply consider the various edges as elements to be selected. The use of one embodiment or the other—that is the granularity of the selection process—merely depends of the type of task carried out by the user.

The invention provides identification of one of the elements, even where the cursor is not actually located over one of the elements. Thus, in the example of FIG. 2, one of the elements is identified, even though cursor H is not located over one of the elements. In addition, there is no need to compute a picking zone; thus, the invention may be carried out, even without prior knowledge of the elements to be displayed.

In step 50, the process tests whether there is a user selection, in other words whether the user has pressed the selection button or the like. If this is the case, the identified element is selected, in step 52. Otherwise, the process goes to step 54 and tests whether the cursor moved.

If the cursor has moved, the process goes to step 44, for computing the new distances to the elements. Else, the process goes to step 48 for identifying the closest element.

The process disclosed in reference to FIG. 3 makes it possible for the user to select one of the displayed elements, without requiring large movements of the cursor on the display. It may be carried out without any prior knowledge of the displayed elements, contrary to the picking zone method of the prior art.

The invention is described above in relation to modelled objects, e.g. parts of modelled objects in a design system. It also applies to handles and tools, as now described. A tool is a set of handles; each handle may be used for acting on a pre-selected object. In these embodiments, handles of the tool are actually straight lines or half-lines—although they are represented to the user by appropriate symbols. The distance is computed between the cursor and the straight line or half-line corresponding to the handle symbol.

Figure 4:
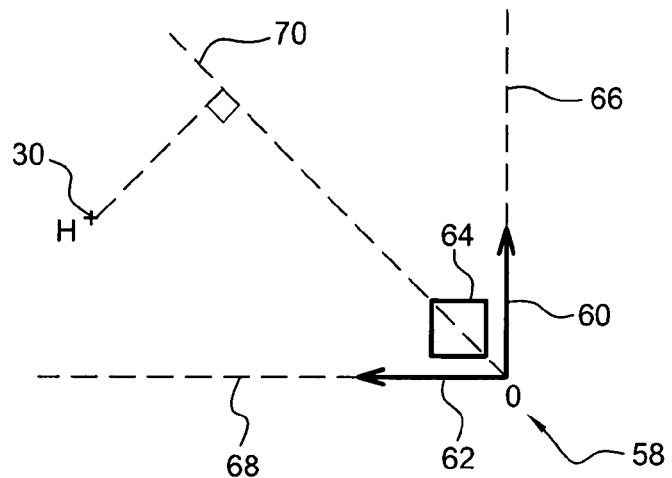
FIGS. 4, 5 and 6 are views of tools according to various embodiments of the invention.

FIG. 4 is a view of a tool according to an embodiment of the invention. The tool of FIG. 4 is used for displacing a pre-selected object over the surface of the display. The tool comprises three handles, which respectively correspond to a vertical translation on the display surface;

a horizontal translation on the display surface and a translation in an oblique or slanted direction.

Specifically, as represented in FIG. 4, the tool 58 first comprises a vertical vector or arrow 60. Vector 60 is the handle which may be used for proceeding with a vertical translation on the pre-selected object. Tool 58 also comprises a horizontal vector or arrow 62. Vector 62 is the handle which may be used for proceeding with a horizontal translation on the pre-selected object. Both vectors are represented to the user with the same origin, referenced 0 in FIG. 4. In the example of FIG. 4, the tool is intended to be displayed in the lower right corner of the display; thus, vector 60 points to the top of the display while vector 62 points to the left of the display. The tool further comprises a square 64. Square 64 is the handle which may be used for proceeding with a translation of the pre-selected object in a slanted direction. Square 64 is represented in tool 58 close to vectors 60 and 62.

For the purposes of selection, each tool handle is actually a half-line, which originates in the common origin O of vectors 60 and 62. Half-line 66 is vertical and directed to the top of the display, like vector 60; half-line 68 is horizontal and directed to the left of the display, like vector 62. Half-line 70 is bisecting half-lines 66 and 68. Half-lines 66, 68 and 70, as well as origin reference O are not displayed to the user, who only sees vectors 60 and 62 as well as square 64.

For selecting one of the handles of the tool, the invention suggests considering the distance between the cursor on the display and the handles. Specifically, the distance is computed as the distance on the display surface between the cursor H and the half-lines 66, 68 and 70. FIG. 4 shows the cursor, which is referenced 30 and H, as well as the projection of the cursor on half-line 70. The distance between the cursor and half-line 70 is the Euclidian distance between the cursor and its projection on half-line 70. The distance between the cursor and the other half-lines is computed similarly. As in the embodiment of FIG. 2, these Euclidian distances could be weighted, e.g. if one of the handles should be selected more often than the others.

The computed distances are compared and one of the handles is identified, according to the results of the comparing step. As above, one may use the closest handle. As discussed above in reference to step 48, one may use several solutions for identifying one of the handles, such as highlighting or flashing the relevant handle. In the position of FIG. 4, the cursor is closer to half-line 70 than to half-lines 66 and 68, so that handle 64 would be identified, e.g. highlighted.

The user may then select the identified handle for using the corresponding tool. In the example of FIG. 4, the user would select handle 64 by pressing the selection button or the like.

Figure 1:
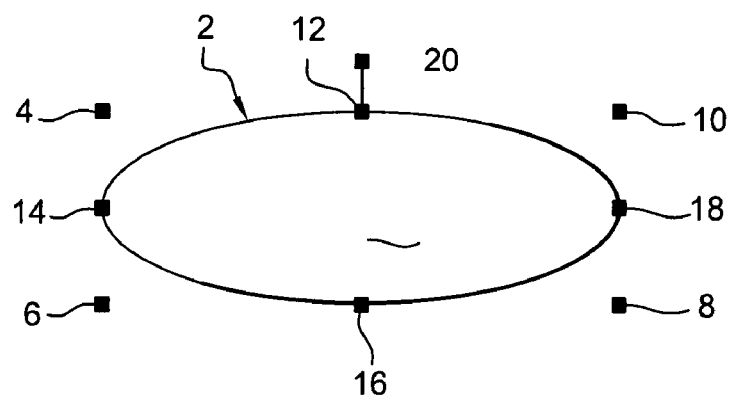
FIG. 1 is an exemplary view of an ellipsis with its handles, in a prior art design system.

Again, the invention avoids the need for the user to move the cursor to the handle to be selected. In the example of FIG. 4, moving the cursor toward to bottom of the display would result in the handle 62 being identified. On the other hand, moving the cursor to the top of the display or to the right of the display would result in the handle 60 being identified. There is no need for the user to move the cursor towards the handle; also, there is no need for the user to move the cursor to a very specific location, as this is the case in the prior art solution depicted in FIG. 1.

Figure 5:
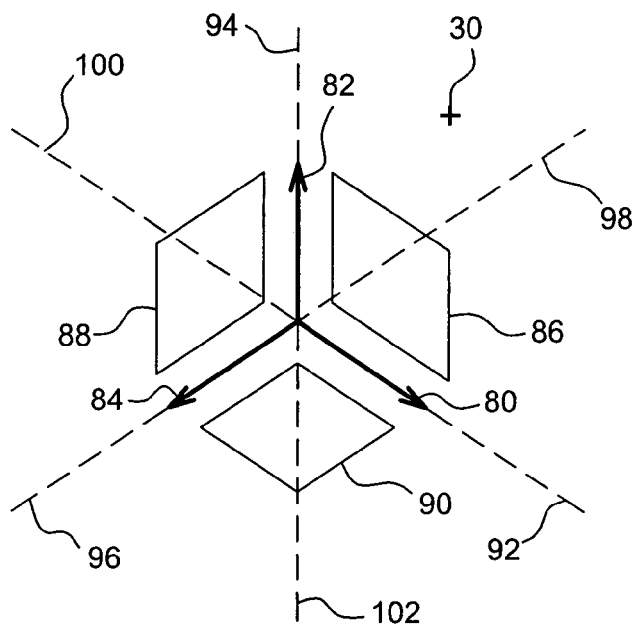

FIG. 5 is a view of a tool according to yet another embodiment of the invention. The tool of FIG. 5 comprises six different handles, corresponding to translations in various directions, in a 3D display. Specifically, the tool comprises three vectors 80, 82 and 84, which allow the user to translate a pre-selected object in three directions; the three directions correspond to three orthogonal directions in the 3D space, e.g. directions x, y and z of a set of coordinate in the 3D space. The surface of the display could for instance be defined as comprising vector 82 and perpendicular to the vector sum of vectors 80 and 84. The tool further comprises three squares 86, 88 and 90; each of the square allows the user to translate a pre-selected objected in a given plane; thus, square 86 corresponds to a translation in the plane defined by vectors 80 and 82, square 88 corresponds to a translation in the plane defined by vectors 82 and 84 and square 90 corresponds to a translation in the plane defined by vectors 80 and 84.

As explained in reference to FIG. 4, one of the handles is identified to the user, according to the position of the cursor, and according to the distance between the cursor and half-lines which correspond to the handles. FIG. 5 shows half-lines 92, 94, 96, 98, 100 and 102, which correspond to the respective handles and are used for computing the distance between the cursor and each of the various handles. Again, the identified handle is the one with the closest distance; in the example of FIG. 5, cursor 30 is closer to half-line 94 than to any other half-line; in other words, cursor 94 is closer to handle 82, so that this handle is identified and may be selected by the user.

In FIG. 5, half lines 92, 94, 96, 98, 100 and 102 are superimposed with handles 80, 82, 84, 86, 88 and 90. One may also display the handles in a location separate from the half-lines. For instance, the half-lines could originate in the middle of the display, while the handles would be displayed in a corner of the display.

Figure 6:
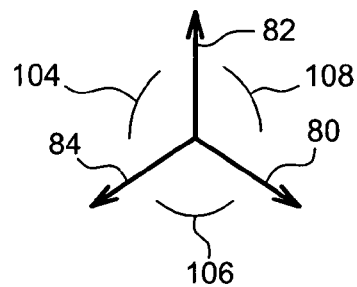
Figure 7:
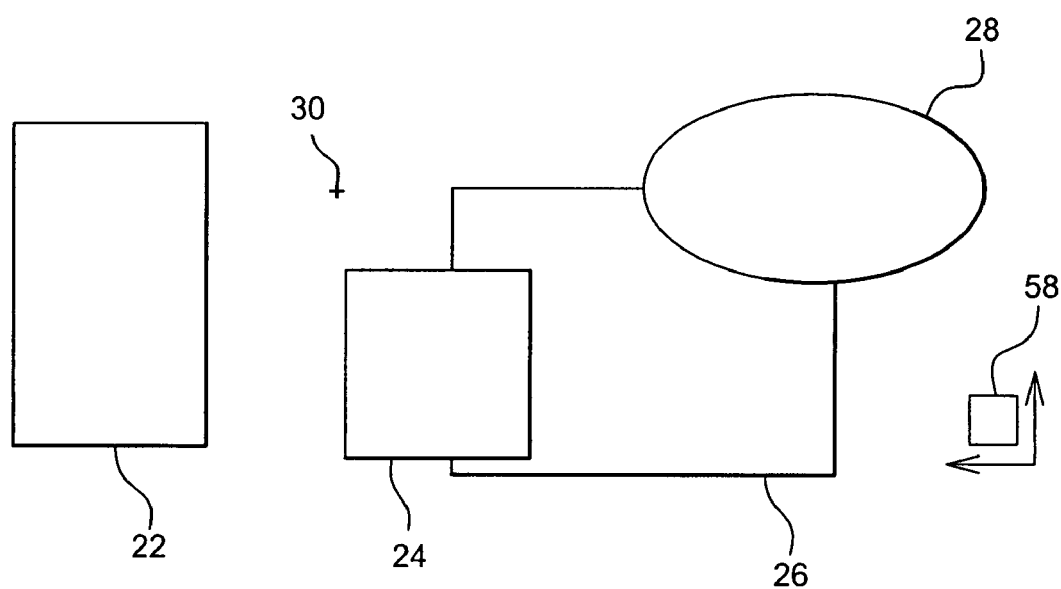

FIG. 6 is a view of yet another tool according to the invention. The tool of FIG. 6 is similar to the one of FIG. 5 and comprises three vectors 80, 82 and 84. However, squares 86, 88 and 90 are replaced by three arcs 104, 106 and 108. Each arc is a handle representative of a rotation around the opposite vector axis; thus, arc 104 is the handle for allowing rotation around the axis of vector 80. The operation and selection of the various handles is similar to the one described in reference to FIG. 5 and is not discussed further.

One may provide other tools, e.g. text zones, scrolling menus, or any other types of tools with separate choices which actually form "handles".

The embodiments of FIGS. 2 and 4 may be used concurrently, as now explained in reference to FIG. 7. The haptic device is a mouse, with a select button. The select button, when pressed and released immediately, is representative of the intention of the user to select one of the modelled objects; the select button, when pressed and dragged, is representative of the intention of the user to select one of the handle. FIG. 7 show the various elements 22, 24, 26 and 28 of FIG. 2, together with tool 58 of FIG. 4. References 60, 62 and 64 are not repeated in FIG. 7, for the sake of clarity.

Assume the cursor 30 is in the position represented in FIG. 4. As explained in reference to FIG. 2, one of the elements 22, 24, 26 and 28 is identified, say element 24. As explained in reference to FIG. 4, one of the handles is identified, say handle 64. If the user clicks on the select button, then element 24 is selected; this may be displayed to the user, e.g. by highlighting and flashing element 24, or by displaying a banner with the references of the identified element. In other words, there is provided a separate representation of selected elements.

Assume now the user moves the haptic device towards the right of the screen. Element 28 will then be identified; note that element 24 will remain selected; also, handle 60 will be identified. If the user presses and releases the select button, he will select element 28 instead of selecting element 24; at this time, element 24 is deselected. However, element 24 being selected, if the user presses the select button and keeps this button pressed while moving the mouse, he will select handle 60 of tool 58 and will move element 24 in a vertical translation. The amount of translation of element 24 then depends on the vertical movement of the mouse while the select button is pressed.

In another embodiment, the position of the tool may vary according to the selected object. For instance, assume again that element 24 is selected. At this time, tool 58, instead of being located on the lower right corner of the screen, could be displayed near or over element 24. This further reduces mouse travel and facilitates the selection of tools.

As a comparison, in a prior art solution, for translating element 24, the user would have to proceed as follows:
first, move the cursor over element 24, and select element 24;
second, move the cursor to the handle 60 and select the handle;
then, move the cursor vertically to displace element 24.

This involves much more path travelled with the cursor. In addition, for selecting handle 60, the cursor has to be precisely located over the handle.

Thus, the invention makes it possible for the user to select various elements on the display, without having to proceed with large movements of the haptic device, and without having to place the cursor of the haptic device in very specific locations.

The invention is not limited to the examples provided in the detailed description given above. Thus, in the example of FIG. 3, it is assumed that the selection process is continuously carried out. One understands that the process may be stopped, once an element is selected. Several examples of distances are discussed in reference to FIGS. 2 and 3. One may allow the user to select one of the distances, or to change the type of distance used for identifying elements, e.g. according to the type of work carried out by the user. In the embodiment of FIG. 4, the tool is intended for being displayed in the lower right corner of the display; the tool may be located elsewhere, e.g. in another corner of the display, in which case the displayed handles and the underlying half-lines would be oriented accordingly. In the description of FIG. 7, one uses a single select button and different actions for distinguishing between selection of modelled objects and selection of handles. One could of course use other solutions, e.g. separate select buttons. For instance, in a two-button mouse, the left button could be used for selection of objects and the right button for selection of tool handles.

One may use several tools at the same time. One could then select the appropriate tool in a first step, according to the distance between the cursor and the various tools. Once a tool is selected, one handle of the selected tool is selected again according to distance. In other words, the process disclosed above is repeated or cascaded.

The invention claimed is:

1. A computer-implemented process for selecting elements among two sets of elements on a display, wherein:
    the first set of elements comprises modeled objects or parts thereof; and
    the second set of elements comprises tools for acting upon elements of the first set,
    the process comprising the steps of:
        displaying at least two elements of the first set on a display and at least two elements of the second set on the display;
        displaying a cursor of a haptic device on the display;
        comparing distances between the elements of each of the two sets and the cursor;
        emphasizing concurrently on the display one of the elements of the first set and one of the elements of the second set, according to the comparing step; and then:
            upon actuation of the user on a selector, selecting the emphasized element of the first set; and
            upon actuation of the user on a selector, selecting the emphasized element of the second set.

2. The process of claim 1, wherein the compared distance, for an element of the first set, is the Euclidian distance between the cursor and a point of the element of the first set.

3. The process of claim 1, wherein the compared distance, for an element of the first set, is a weighted Euclidian distance between the cursor and a point of the element of the first set.

4. The process of claim 3, wherein the weighting factor for an element is representative of the surface of the element on the display.

5. The process of claim 2, wherein an element of the first set is a 3D element and wherein the point of the element is the projection on the display surface of a barycentre of the 3D element.

6. The process of claim 1, wherein the step of comparing comprises comparing distances between the cursor and the outline of each element of the first set.

7. The process of claim 1, wherein an element of the second set displayed on the display is associated with a half-line, and wherein the step of comparing comprises comparing distances between cursor and associated half-lines.

8. The process of claim 1, wherein an element of the second set displayed on the display is associated with a half-line, and wherein the step of comparing comprises comparing weighted distances between cursor and associated half-lines.

9. The process of claim 1, wherein an element of the second set displayed on the display is associated with a half-line, said element associated with a half-line being a tool handle and wherein the step of comparing comprises comparing distances between cursor and associated half-lines.

10. The process of claim 1, wherein the step of emphasizing comprises emphasizing the element of the first set and the element of the second set with the smallest distance.

11. A data storage medium comprising storage instructions for selecting elements among two sets of elements on a display in a computer system, having a display and a haptic device, the instructions comprising:
    a routine for displaying on the display at least two elements of a first set of elements comprising modeled objects or parts thereof and at least two elements of a second set of elements comprising tools for acting upon elements of the first set;
    a routine for displaying a cursor of the haptic device on the display;
    a routine for comparing distances between the elements of each of the two sets and the cursor;
    a routine for emphasizing concurrently on the display one of the elements of the first set and one of the elements of the second set, according to the routine for comparing; and then:
        a routine for selecting the emphasized element of the first set upon actuation of the user on a selector of the computer system; and
        a routine for selecting the emphasized element of the second set upon actuation of the user on a selector of the computer system.

12. The data storage medium of claim 11, wherein, the routines of the program are further adapted for:
    varying the position of the emphasized element of the second set near or over the selected emphasized element of the first set after selection of the emphasized element of the first set and before selection of the emphasized element of the second set.

13. A computer-implemented process for selecting elements among two sets of elements on a display, wherein:
    the first set of elements comprises modeled objects or parts thereof; and
    the second set of elements comprises tools for acting upon elements of the first set, the process comprising the steps of:
        displaying at least two elements of the first set on a display wherein said elements comprise displayed objects;
        an element is a 3D element and a point of the element is the projection on the display surface of a barycentre of the 3D element;
        displaying at least two elements of the second set on the display wherein an element of said second set is associated with a half-line, and said element associated with a half-line is a tool handle for acting upon elements of the first set;
        displaying a cursor of a haptic device on the display;
        selecting an element of the first set and selecting an element of the second set, independently, according to a process comprising the steps of:
            comparing distances between the cursor and each element wherein the compared distance, for an element of the first set, is the Euclidian distance between the cursor and a point of the element or a weighted Euclidian distance between the cursor and a point of the element and, for an element of the second set, is the distance between cursor and associated half-lines;
            emphasizing concurrently on the display one of the elements of each set, according to the results of the comparing step comprising emphasizing the element with the smallest distance;

and then:

upon actuation of the user on a selector, selecting the emphasized element of the first set; and upon actuation of the user on a selector, selecting the emphasized element of the second set.

14. The process of claim 1, wherein the step of selecting comprises:

upon actuation of the user on a selector, selecting the emphasized element of the first set;

upon user motion of the haptic device, displaying the cursor of the haptic device on the display;

comparing distances between the elements of each of the two sets and the cursor;

emphasizing concurrently on the display one of the elements of the first set and one of the elements of the second set, according to the comparing step; and upon actuation of the user on a selector, selecting the emphasized element of the second set and acting on the selected element of the first set.

15. The process of claim 2, further comprising after the step of selecting the emphasized element of the first set, a step of:

varying the position of the emphasized element of the second set near or over the selected emphasized element of the first set.

16. The data storage medium of claim 11, wherein, the routine for selecting is adapted for:

selecting the emphasized element of the first set upon actuation of the user on a selector;

displaying the cursor of the haptic device on the display upon user motion of the haptic device;

comparing distances between the elements of each of the two sets and the cursor;

emphasizing concurrently on the display one of the elements of the first set and one of the elements of the second set, according to the comparing step; and upon actuation of the user on a selector, selecting the emphasized element of the second set and acting on the selected element of the first set.

17. The process of claim 1, wherein the steps of selecting the emphasized element of the first set and selecting the emphasized element of the second set are carried out in different manner.

18. The process of claim 17, wherein the step of selecting the emphasized element of the first set is carried out by a press-and-release actuation on the selector.

19. The process of claim 17, wherein the step of selecting the emphasized element of the second set is carried out by a press-and-drag actuation on the selector.

20. The process of claim 17, wherein the step of selecting the emphasized element of the first set is carried out by the actuation of the left button of the haptic device, and wherein the step of selecting the emphasized element of the second set is carried out by the actuation of the right button of the haptic device.

21. The process of claim 20, wherein the haptic device is a mouse comprising at least two buttons.

\* \* \* \* \*